(12) United States Patent
Knierim

(10) Patent No.: US 7,629,761 B2
(45) Date of Patent: Dec. 8, 2009

(54) SYSTEM FOR MEASURING CURRENT IN MULTIPLE MOTOR COILS USING A SINGLE SENSING ELEMENT

(75) Inventor: David L. Knierim, Wilsonville, OR (US)

(73) Assignee: Xerox Corporation, Norwalk, CT (US)

( * ) Notice: Subject to any disclaimer, the term of this patent is extended or adjusted under 35 U.S.C. 154(b) by 352 days.

(21) Appl. No.: 11/827,759

(22) Filed: Jul. 13, 2007

(65) Prior Publication Data

US 2009/0015184 A1    Jan. 15, 2009

(51) Int. Cl.
H02P 27/06 (2006.01)
G01R 19/00 (2006.01)

(52) U.S. Cl. .................. 318/490; 318/254; 318/294; 318/400.29

(58) Field of Classification Search ............ 318/254, 318/294, 490, 400.29
See application file for complete search history.

(56) References Cited

U.S. PATENT DOCUMENTS

| | | | |
|---|---|---|---|
| 5,629,598 A * | 5/1997 | Wilkerson | 318/808 |
| 5,646,520 A * | 7/1997 | Frank et al. | 324/158.1 |
| 5,877,950 A | 3/1999 | Bonsignour et al. | |
| 5,982,133 A * | 11/1999 | Murakami et al. | 318/650 |
| 6,134,126 A * | 10/2000 | Ikekame et al. | 363/39 |
| 6,301,137 B1 | 10/2001 | Li | |
| 6,459,597 B1 * | 10/2002 | Igarashi et al. | 363/39 |
| 6,933,688 B2 * | 8/2005 | Junnan et al. | 318/400.29 |
| 6,949,927 B2 * | 9/2005 | Goetz | 324/252 |
| 6,998,800 B2 | 2/2006 | Fulton | |
| 7,336,045 B2 * | 2/2008 | Clermonts | 318/400.29 |
| 2002/0075702 A1 * | 6/2002 | Igarashi et al. | 363/35 |
| 2003/0048086 A1 | 3/2003 | Takahashi et al. | |
| 2003/0057938 A1 * | 3/2003 | Goetz | 324/117 R |
| 2003/0066749 A1 | 4/2003 | Golovchenko et al. | |
| 2004/0041549 A1 * | 3/2004 | Halfman et al. | 323/282 |
| 2005/0264246 A1 * | 12/2005 | Beulich et al. | 318/254 |
| 2008/0061727 A1 * | 3/2008 | Tomigashi | 318/768 |
| 2008/0084719 A1 * | 4/2008 | Biribauer et al. | 363/54 |

(Continued)

FOREIGN PATENT DOCUMENTS

JP    2009022156 A  *  1/2009

Primary Examiner—Paul Ip
(74) Attorney, Agent, or Firm—Maginot, Moore & Beck, LLP

(57) ABSTRACT

A circuit enables current to be measured in at least two motor leads of a three-phase motor being supplied by a power source generating a chopped sinusoidal waveform for the motor leads. The circuit includes a DC power supply having a pair of output terminals, a current sense transformer having a primary winding and a secondary winding, the primary winding being connected at one end to one output terminal of the DC power supply, an H-bridge driver connected to another end of the primary winding and being connected to leads of a three-phase motor to drive each lead to a voltage obtained from the DC power supply through the primary winding, a regulating circuit for identifying the voltage to which each lead is to be driven and for controlling switches within the H-bridge circuit to drive each lead to an identified voltage, and a single current sense resistor connected to the secondary winding of the current sense transformer, the current sense resistor generating a voltage that corresponds to the current being used to drive the three-phase motor.

20 Claims, 3 Drawing Sheets

U.S. PATENT DOCUMENTS

| | | | |
|---|---|---|---|
| 2008/0252250 A1* | 10/2008 | Hida et al. | 318/801 |
| 2009/0026988 A1* | 1/2009 | Tomigashi | 318/400.02 |
| 2009/0058334 A1* | 3/2009 | Yamamoto | 318/400.02 |

* cited by examiner

SYSTEM FOR MEASURING CURRENT IN MULTIPLE MOTOR COILS USING A SINGLE SENSING ELEMENT

TECHNICAL FIELD

This disclosure relates generally to electrical motor control and, more particularly, to the measurement of current being supplied to an electrical motor.

BACKGROUND

Three-phase motors are used in various applications. The motors are typically energized with a power source in one of two forms. In one form, the input signal is a sine wave with each of the three motor leads being driven with a voltage or current sine wave that has a 120 degree phase difference between each lead. In the other form, "trapezoidal commutation" is used to provide a controlled current that drives only two of the three motor leads at any point in time. Sine waves are typically used to drive larger, higher performance motors. Lower cost trapezoidal commutation is used for small motors.

Three-phase motors driven by sine waves are controlled by a motor drive that regulates the phase and amplitude relationship of the three sine waves being supplied to the motor. Most three-phase motor drives include circuitry to measure current in the motor leads. These current measurements are typically used in a feedback loop to adjust motor lead voltages and obtain desired current values. These measurements, however, may be used simply to detect excessive currents, which imply a fault condition.

Three-phase motor currents are conventionally sensed by one of three methods. In one method, which is used for motors driven by trapezoidal commutation only, a single sense resistor is used to measure current in a supply leg common to all three H-Bridge drivers. In another method, three sense resistors, one in the supply leg of each H-Bridge driver, are monitored to measure current to the motor. The third method uses three current sense elements with each one being in series with one of the motor leads. Alternatively, this method may be performed with two sense resistors. Each one of the sense resistors is connected in series with a motor lead and the third current is calculated as the negative sum of the currents in the other two leads.

The first technique may be implemented at a cost lower than the other two, but it suffers from two limitations. As already noted, it is only utilized with trapezoidal drives, which typically drive small three-phase motors, because it is considered too inefficient for larger motors. Secondly, this approach requires the sense resistors to be directly in the current path. Consequently, current transformers, which are used to sense current in larger motors, may not be used with this method because the DC component of the current presents flux issues.

While the other two methods are suitable for use with larger three-phase motors, they are generally more expensive to implement. Additionally, increased switching losses may arise from the typical sinusoidal drives used with these methods. In conventional sinusoidal drives, all three motor leads are driven at all times. The relatively continuous switching causes more losses and is therefore less efficient than methods that selectively drive fewer than all of the leads. Thus, larger three-phase motors driven by conventional sinusoidal drives need more economical current sensing methods and more efficient driving methods.

SUMMARY

A circuit has been developed that uses a single current sensing element to measure current in each lead of a three-phase motor. Additionally, the circuit may be arranged to drive fewer than all of the motor leads. A circuit enables current to be measured in at least two motor leads of a three-phase motor being supplied by a power source generating a chopped sinusoidal waveform for the motor leads. The circuit includes a DC power supply having a pair of output terminals, a current sense transformer having a primary winding and a secondary winding, the primary winding being connected at one end to one output terminal of the DC power supply, an H-bridge driver connected to another end of the primary winding and being connected to leads of a three-phase motor to drive each lead to a voltage obtained from the DC power supply through the primary winding, a regulating circuit for identifying the voltage to which each lead is to be driven and for controlling switches within the H-bridge circuit to drive each lead to an identified voltage, and a single current sense resistor connected to the secondary winding of the current sense transformer, the current sense resistor generating a voltage that corresponds to the current being used to drive the three-phase motor.

A method that may be implemented with the circuit enables measurement of current through one or more motor leads of a three-phase motor. The method includes supplying DC power to a primary winding of a current sense transformer, selectively coupling the primary winding of the current sense transformer to one or more leads of a three-phase motor, measuring a voltage across a resistor connected to a secondary winding of the current sense transformer, and comparing voltages measured across the resistor to identify currents in at least one lead of the three-phase motor.

BRIEF DESCRIPTION OF THE DRAWINGS

The foregoing aspects and other features of a circuit in which current to the leads of a three-phase motor are measured with a single sensing element are explained in the following description, taken in connection with the accompanying drawings, wherein.

DETAILED DESCRIPTION

Figure 1:
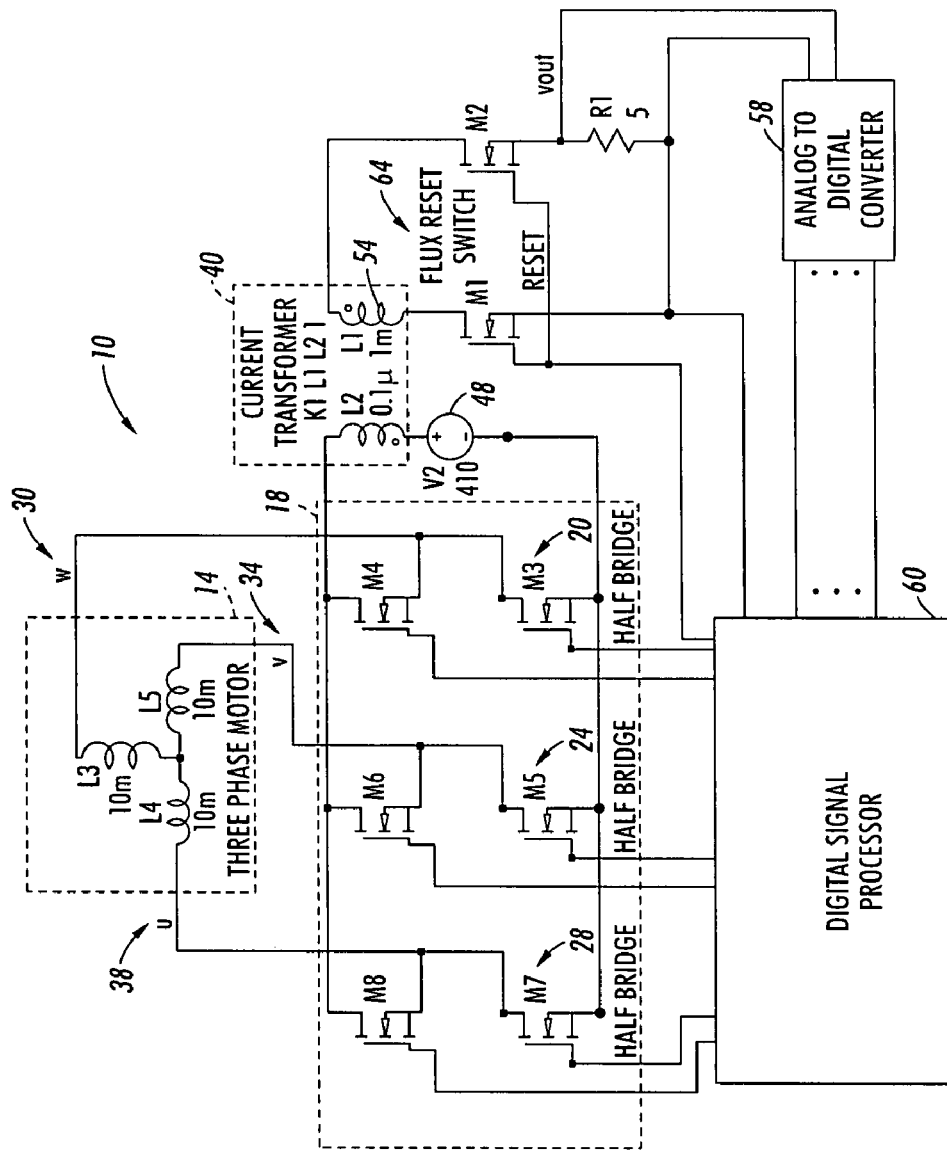
FIG. 1 is a schematic diagram of a circuit that uses a single current sensing element to measure current in all the leads of a three-phase motor.

A circuit 10 in which a conventional three-phase motor 14 is driven by an H-bridge driver 18 is shown in FIG. 1. In the exemplary circuit shown in FIG. 1, the motor 14 rotates a print drum in a printer. The H-bridge driver 18 generates square wave pulses whose long term (millisecond) averages approximate sine waves for input to the leads of the motor 14 for smoother and more efficient operation of the motor. Three half-bridges 20, 24, and 28 of the H-bridge driver, one for each motor lead 30, 34, and 38, are coupled to a single current transformer 40. The three half-bridges 20, 24, and 28 selectively connect voltage from the DC power supply 48 via current transformer 40 to the motor leads 30, 34, and 38, respectively, through switches M4, M6, and M8, respectively. Each of the three half-bridges 20, 24, and 28 also selectively couples the motor leads 30, 34, and 38, respectively, to the negative terminal of DC power supply 48 through switches M3, M5, and M7, respectively. The on/off state of the switches, M3-M8, in the half-bridges 20, 24, and 28 are controlled by a circuit for regulating the current supplied to the motor 14. In the circuit shown in FIG. 1, the regulating circuit is a digital signal processor (DSP) 60 configured to control the current provided to the motor 14 as described in more detail below.

To perform the half-bridge control, the gate of switch M8 is connected to an output of the DSP 60 as are the gates of M6 and M4. When the DSP 60 asserts a signal to turn on a switch M8, M6, or M4, the motor lead connected to the source of the switch is connected to the output of the current transformer 40 on the drain of the switch. Similarly, the gates of switches M7, M5, and M3 are connected to the DSP 60. When the DSP 60 asserts a signal on the gate of a switch that turns the switch on, the lead connected to the drain of the switch is connected to the negative terminal of DC power supply 48. The DSP 60 operates the pair of switches in a half-bridge so both switches are not turned on at the same time.

The DC supply 48 has a pair of output terminals. Primary winding 44 of the current transformer 40 is connected to the positive output terminal of the DC supply 48 to provide electrical power to the motor 14. The other (negative) output terminal of the DC supply 48 is connected to the low side switches M3, M5, and M7 of half-bridges 20, 24, and 28. In the circuit 10 shown in FIG. 1, DC supply 48 generates 410 volts DC to energize the motor 14, although the sensing circuit described below may be used with power supplies generating other output levels. While the positive lead of the DC supply is shown as being connected to the current transformer 40, the negative lead could be used instead. The secondary winding 54 of the current transformer 40 is connected at one end to the drain of switch M2 and at its other end to the drain of switch M1. The source of the switch M2 is connected to a common node, which is typically electrical ground, and the source of the switch M1 is connected to the same common node through a sense resistor 50. The gates of the switches M1 and M2 are coupled to the current regulating circuit, such as the DSP 60, to receive a reset signal. The switches M1 and M2 are configured to operate as a flux reset switch in a manner described in more detail below. In the circuit 10, the motor current is measured as a voltage drop across a sense resistor 50. The voltage drop across the sense resistor 50 is provided to an analog-to-digital (AD) converter 58 to generate a digital value at specific times as described below.

As shown in the exemplary circuit 10 of FIG. 1, the H-bridge driver 18 is coupled to the digital signal processor (DSP) 60, which is configured to implement a servo control method. The servo control method performs two functions. In one embodiment, each function is executed once during each 50-microsecond chop cycle, which corresponds to a 20 KHz pulse rate for the motor leads. The first function compares a measured drum position with an expected drum position and expected motor rotor position, which is derived from the phase angle, to calculate targets for the motor lead currents. The drum position is measured using an encoder that is mounted to a longitudinal shaft about which the print drum rotates. The second function compares the measured motor lead currents obtained from the voltage drop across the sense resistor 50 with the target motor lead currents to generate the appropriate motor lead voltages for the next chop cycle.

In the circuit 10 shown in FIG. 1, the regulating circuit is implemented with a DSP. The DSP may be manufactured with an operating program stored in internal non-volatile memory or the DSP may a version that can be coupled to external memory for execution of an operating program. Alternatively, the servo control functions, current sensing functions, and flux resetting function may be implemented with a general-purpose microprocessor that executes programmed instructions stored in memory. In yet another embodiment, the regulating circuit may be implemented with an appropriately configured circuit of discrete hardware components or a combination of discrete hardware components and software.

The DSP 60 is also configured to subtract the lowest of the three lead voltages from each of the three lead voltages. This operation shifts the lowest lead voltage to zero volts. Consequently, no pulse is required for that motor lead, and thus, switching power dissipation for the half-bridge coupled to that lead is avoided. Because three-phase motors respond only to the differences between the voltages on its leads, forcing the lowest voltage lead to zero volts has no effect on motor operation.

Measuring the motor lead currents with a single sensing resistor is now discussed in greater detail. As shown in FIG. 1, the lead wires of the three-phase motor 14 are labeled U (38), V (34), and W (30), which correspond to conventional nomenclature for three-phase motor leads. For each chop cycle, the desired motor lead voltages, as calculated by the DSP, are compared to determine which lead has the highest voltage, which one is the lowest voltage, and which one is intermediate the highest and the lowest voltages. The comparison may be performed, for example, by a DSP. The motor leads are pulsed at a 20 KHz rate, which means one pulse is generated for a motor lead every 50 microseconds. For the first two microseconds of each 50-microsecond chop period, all motor leads are driven low by turning on the low side switch of each of the three half-bridges. That is, the DSP 60 asserts the signals to the gates of M7, M5, and M3 to turn on the switches and connect each of the motor leads W, V, and U, respectively, to the negative DC power supply terminal. At the same time, the reset signal to the switches M1 and M2 is set low to turn off these switches to reset the flux in the current transformer 40. The reset signal remains turned off for approximately two microseconds so a voltage can be generated across the current transformer 40 to reset the magnetic flux in the core of the transformer. The reset signal is then set high to turn the switches on so the current induced in the secondary winding 54 can be sensed at the resistor 50.

At the end of this first two-microsecond period, the voltage drop across the sense resistor 50 is sampled and measured by the AD converter 58. This measurement should be zero, as no current should be flowing in any of the motor leads. Any voltage measured at this time indicates a DC offset voltage in the measurement path for which adjustment should be made. At the beginning of the following two-microsecond period, the half-bridge driving the motor lead needing the highest voltage pulse, which is determined by the DSP in a conventional process, is set high. That is, the low side switch for the half-bridge corresponding to the motor lead to be driven at the highest voltage level is turned off and then the high side switch (M4, M6, or M8) is turned on. At the end of this second two-microsecond period, the voltage drop across the sense resistor 50 is again measured by the AD converter 58. At the beginning of the third two-microsecond period, the half-bridge driving the motor lead at the next highest (intermediate) voltage level, again as determined by the DSP in a conventional manner, is set high so its low side switch is turned off and then its high side switch is turned on. At the end of this third two-microsecond period, the voltage drop across the sense resistor 50 is measured by the AD converter 58. This measurement of the voltage across the sense resistor 50 is the third and final voltage measurement taken during a single 50-microsecond chop period.

During the remainder of the chop period, the two active motor leads are turned off at the time necessary to provide the target average voltage for the motor lead. For example, if the highest voltage lead needed 205 volts, the high side switch (M4, M6, or M8) for the corresponding half-bridge would be turned off at 27 microseconds into the chop period, which is 25 microseconds after it was turned on. This produces a 50% duty cycle for the voltage pulse, since 205 volts=50% times the 410 volt DC supply depicted in FIG. 1. If the second lead requires 41 volts, the high side switch (M4, M6, or M8) for the corresponding half-bridge would be turned off at 9 microseconds into the chop period. Because this switch was turned on at 4 microseconds into the chop period, which is the end of the second two-microsecond period, the pulse duration for this motor lead is 5 microseconds, which produces a 10% duty cycle or 41 volts.

During each chop cycle, one lead is always considered to be at 0 volts by the regulating circuit, which is the DSP 60 in FIG. 1. The motor 14 responds only to relative voltages between its three leads, so no loss in generality occurs by forcing the most negative motor lead voltage to be 0 volts. The requirement of having one motor lead at 0 volts is not necessary for sensing for measuring current through the single resistor 50. Instead, the circuit is operated in this manner to reduce switching losses arising from supplying a voltage pulse to all of the motor leads during a chop cycle. The third motor lead may be pulsed after the current measurements have been taken, however, if switching losses are not a concern.

At the end of the third two-microsecond period, which is six microseconds into the chop cycle, the AD converter 58 has measured three sense resistor voltage drops that are proportional to the current being drawn from the DC supply 48. The first measurement occurred with all the motor leads at 0 volts. The second measurement was taken when the highest voltage lead was at DC supply output level, and the third measurement was sampled when both the highest and next highest (intermediate) voltage leads were at the DC supply level. Motor lead current may be calculated from these measurements as follows:

Highest voltage motor lead current=second measurement−first measurement;

Next highest voltage motor lead current=third measurement−second measurement;

Lowest voltage (remaining) motor lead current=first measurement−third measurement.

These three motor lead currents are assigned to physical motor leads (U, V, and W) based on the previous determination of which lead had the highest voltage, the next highest voltage, and the lowest voltage. Provided the single current sensing element is used in a circuit in which the first measurement is always zero, the first measurement described above may be eliminated so the second measurement becomes the first measurement and the third measurement is the second measurement. The computation of the voltages then substitutes the value of zero for the first measurement in the three calculations described in the bullets listed above.

If a target motor lead voltage as determined by the regulating circuit requires a pulse having a duration that is less than the minimum pulse length needed for measurement, which in the example is four microseconds for the highest voltage lead and two microseconds for the next highest voltage lead, the chop circuitry still applies the minimum voltage at the minimum pulse width so the current can be measured. The resulting small errors in voltage between what the regulating circuit targeted and what the motor receives do not significantly affect motor performance because the DSP's current control loop adjusts future chop cycles to compensate. This type of operation, however, does cause the motor to generate audible noise. Removing the zero-volt requirement on the third motor lead helps eliminate this noise at the expense of higher switching losses in the half-bridges. Audible noise is a problem only at low motor speeds, which require low motor voltages. Many potential applications do not require extended periods of operation at low speeds, so these applications would not generate audible noise by using the zero-volt requirement for the one motor lead even though each motor lead current is measured through a single sensing resistor. Alternatively, the DSP can dynamically choose whether to output zero volts on the lowest-voltage motor lead. This decision is based on whether the voltages on the two higher-voltage leads are above the minimum voltage (minimum pulse width) required for current measurement. Using this criterion, high-power motor operation requiring higher lead voltages results in driving only two motor leads at a time, while low-power motor operation is achieved by driving all three motor leads. Low-power operation involves less power loss in the H-bridge drivers, so the extra power loss incurred by driving all three leads simultaneously is not problematic.

The discussion above shows how all three motor lead currents can be measured using a single current sense point. One issue that arises from the use of the current sense transformer is how best to handle the DC component of current through the current sense transformer. Current sense transformers are conventionally used in one of two situations. In the first scenario, a current sense transformer is used with an AC supply, such as a 60 Hz power main, that produces negligible DC current. The second scenario occurs in switching DC power supplies where the supply switches the output current between a positive value and zero without going negative. In the three-phase motor drive application described above, the current transformer sees DC current, as is the case in the DC power supply scenario, however, unlike the power supply case, the DC current can be of either polarity.

Conventional switching DC power supplies typically include a diode that is connected in series with the secondary winding of the current sense transformer. When the primary side current switches to zero, the voltage across the transformer windings goes negative due to magnetic flux that has built up in the core during the previous period of positive current and voltage. The diode connected in series with the secondary winding allows a relatively high negative voltage across the current transformer to reset the magnetic flux in the current sense transformer quickly. Connecting a diode in series with the secondary winding in the current sense transformer of FIG. 1, however, does not reset the magnetic flux because the transformer current, and therefore, magnetic flux and voltage may be of either polarity.

To reset the magnetic flux in the circuit of FIG. 1, a magnetic flux reset switch 64, which includes field effect transistors M1 and M2, is placed in series with the current transformer secondary winding instead of a diode. The switch is closed throughout a chop cycle, except for the zero-current portion at the beginning of each chop cycle, so current may be sensed in the resistor 50. During the zero-current portion of each chop cycle, the magnetic flux reset switch 64 is opened to allow a sufficiently high voltage across the transformer to reset the magnetic flux in its core. The flux reset switch is opened in the circuit 10 of FIG. 1 by having the regulating circuit, DSP 60, in the depicted embodiment, apply a low signal to the gates of switches M1 and M2. The opening of these switches allows a resetting voltage to form across the transformer.

In another embodiment a transformer having a gapped core is used so no flux resetting switch or diode is required. A transformer does not require a flux resetting switch or diode because a gapped core can handle DC current without saturating. Gapped core transformers do not work in typical switching DC power supplies because only the AC portion of the current waveform passes through the transformer. Gapped core transformers do operate in this three-phase motor drive circuit because the zero-current value is measured at the beginning of each chop cycle. Because each motor lead current is calculated as the difference of two measurements of transformer secondary current, any current offset value imposed by the transformer's not passing DC current is canceled in these subtractions. A disadvantage that arises from the incorporation of a gapped core current transformer without flux resetting circuitry is the doubling of the range that the AD converter needs to be able to measure. The range is increased because the current through the resistor 50 is the sum of the real motor lead currents and the offset current caused by the missing DC current at the transformer secondary. Consequently, some applications may be better served by a current sense transformer with a magnetic flux resetting switch, while others are better suited for a gapped transformer alone.

Figure 2:
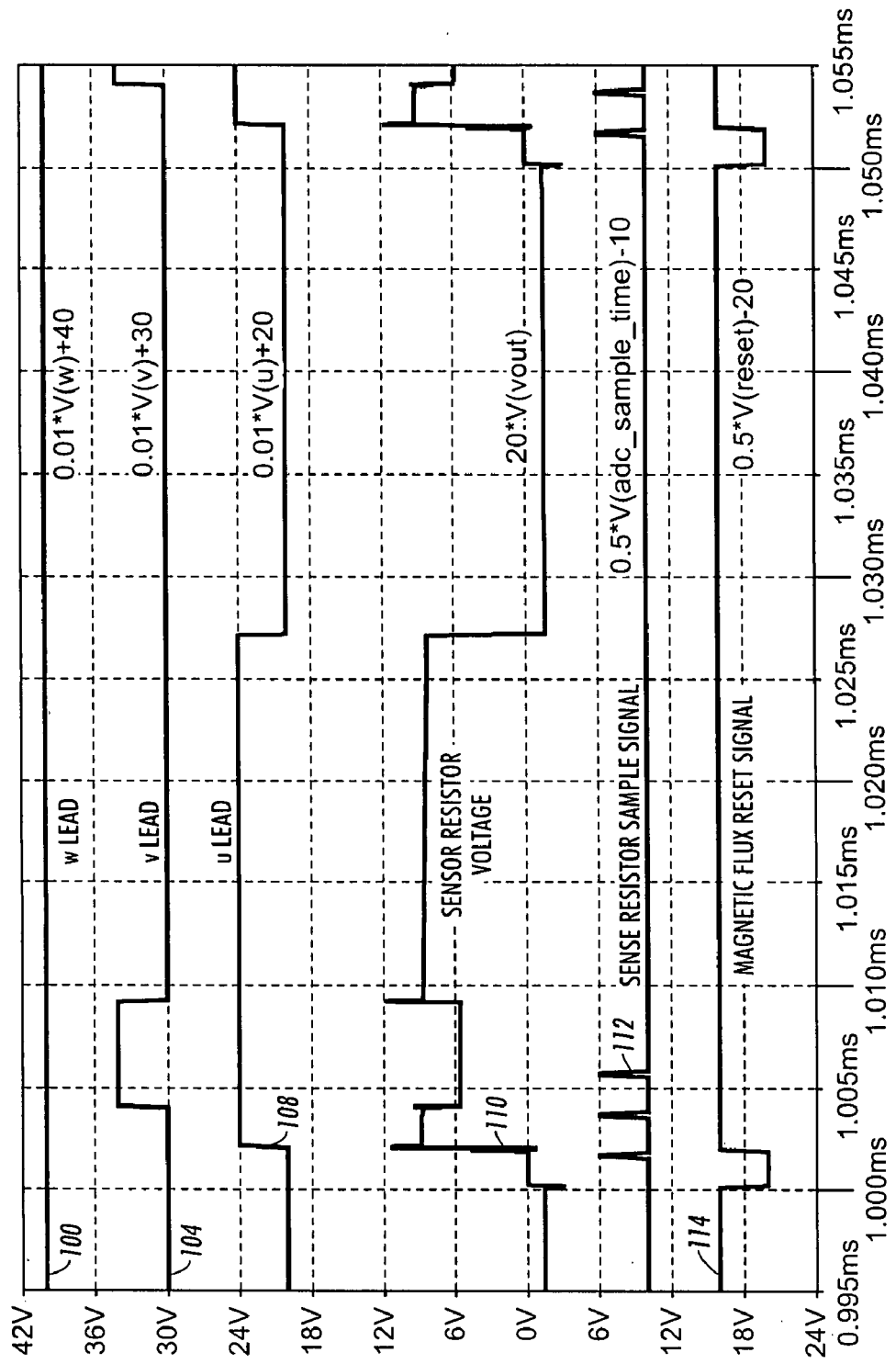
FIG. 2 is a graph of voltages occurring during operation of the circuit shown in FIG. 1.

A simulation output plot for the circuit shown in FIG. 1 is depicted in FIG. 2. The traces depicted are offset and scaled for easier viewing. From top to bottom, the trace 100 is for motor lead W, trace 104 is for motor lead V, trace 108 is for motor lead U, trace 110 is the voltage across sense resistor 50, trace 112 is the sample signal for the AD converter 58, and trace 114 is the magnetic flux reset signal. As described above, the magnetic flux reset signal is a low-true signal, which is high most of the time, but set low to reset the flux in the current sense transformer 60. For the depicted simulation, the current transformer inductance has been made artificially low (by a factor of 10) over an actual embodiment so the effect of the flux is large enough to view easily on the plot in the graph. As may be observed from the graph, the voltage across the sense resistor 50 transitions to zero volts during the reset pulse.

Figure 3:
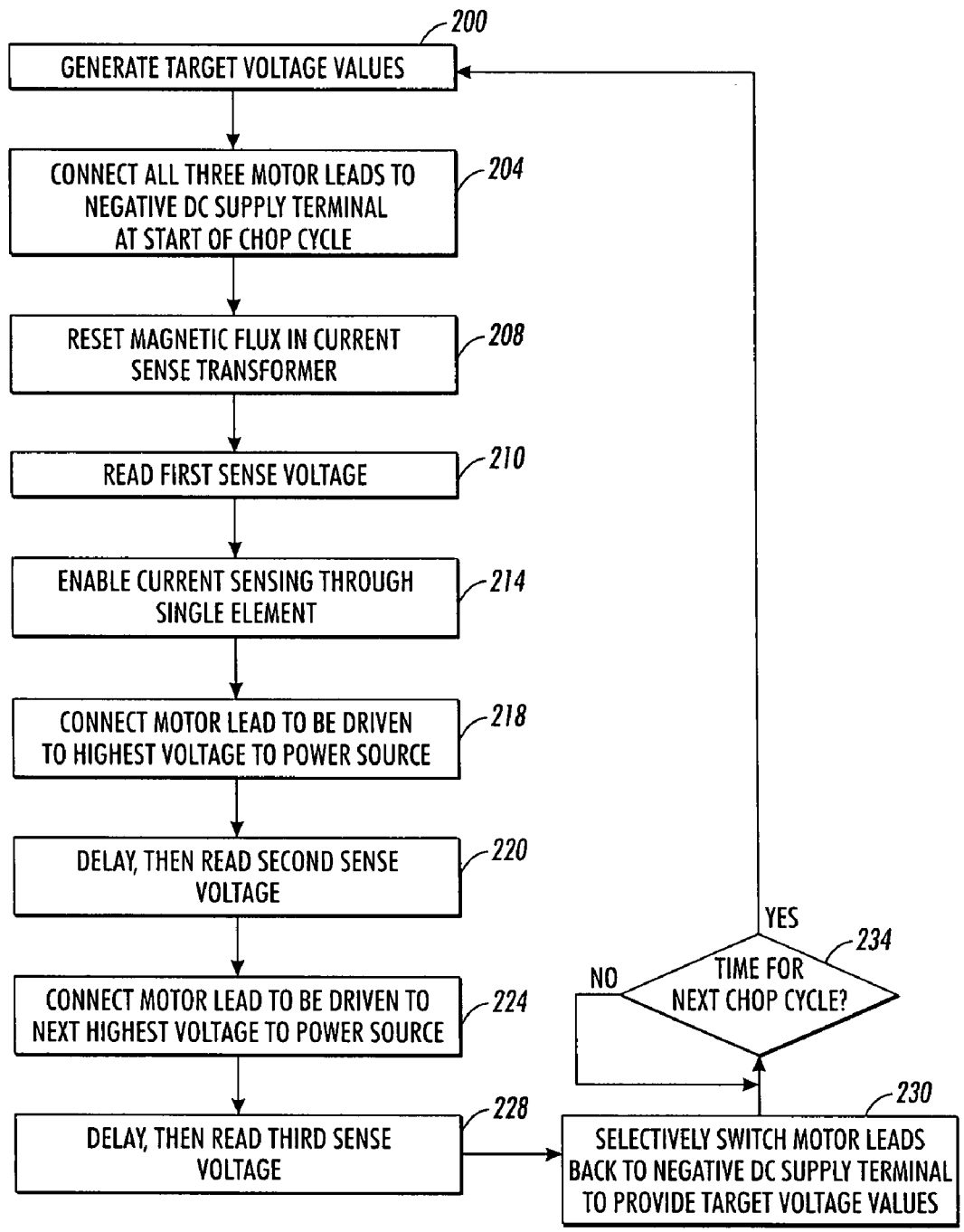
FIG. 3 is a flow diagram of a method that may be implemented with the circuit of FIG. 1.

As shown in FIG. 3, a method for sensing current for each lead of a three-phase motor driven by a chopped sinusoidal electrical source through a single current sensing element begins with a regulating circuit computing target voltages for each motor lead for the next chop cycle (block 200). The target voltages are derived in a conventional manner from the current measurements obtained at the beginning of a chop cycle. The lowest value may be adjusted to zero as described above. At the beginning of a chop cycle, the leads of the motor are connected to the negative DC power supply terminal in preparation for the next pulse (block 204). The magnetic flux reset signal is also asserted so the magnetic flux within the current sense transformer is reset (block 208). The voltage across the sense resistor is sampled and measured by the A/D converter and then read by the regulating circuit (block 210). The magnetic flux reset signal is then returned to its non-active state to enable current sensing through the resistor (block 214) and the lead to be driven to the highest voltage is then connected to the output of the primary winding of the current sense transformer (block 218). After the lapse of a time period that ensures the voltage on the motor lead and current through the transformer have settled, the second current sample is measured and read (block 220). The motor lead to be driven to the next highest voltage is then connected to the output of the primary winding of the current sense transformer (block 224). After the lapse of a time period that ensures the voltage on the motor lead and current through the transformer have settled, the third current sample is measured and read (block 228). If the lowest voltage lead was not adjusted to zero, then that lead may be connected to the output of the primary winding and optionally another current sample measured and read. This fourth measurement should be zero, as was the case with the first measurement, so it is redundant and is performed as an error check. The connections to the primary winding are removed at the appropriate times for the duty cycles corresponding to the voltages to which the leads are to be driven (block 230). The process then waits until the time is reached to calculate the new target voltages for the motor (block 234).

Those skilled in the art will recognize that numerous modifications can be made to the specific implementations described above. For example, the two-microsecond periods noted above were selected as that time period was determined to be sufficient for the H-bridge to change state and for the current in the transformer to settle to a stable reading. This sample timing may vary with different implementations. For example, the time period may be as low as 0.1 microseconds for low-voltage, high frequency systems. In systems using IGBT or thyristor H-bridges, which are typically used in large industrial motor controllers, the sample period may be as large as 5 to 10 microseconds. Likewise, the 50-microsecond chop period may vary for target frequencies that differ from the 20 KHz frequency discussed above. Also, the current sense transformer may be removed from the circuit and the sense resistor connected to one of the leads from the DC power supply for sensing current through the motor leads. This embodiment does not require magnetic flux resetting. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

I claim:

1. A circuit for sensing current in at least two leads of a three-phase motor comprising:

a DC power supply having a pair of output terminals;

a current sense transformer having a primary winding and a secondary winding, the primary winding being connected at one end to one output terminal of the DC power supply;

an H-bridge driver connected to another end of the primary winding and being connected to leads of a three-phase motor to drive each lead to a voltage obtained from the DC power supply through the primary winding;

a regulating circuit for identifying the voltage to which each lead is to be driven and for controlling switches within the H-bridge circuit to drive each lead to an identified voltage; and a single current sense resistor connected to the secondary winding of the current sense transformer, the current sense resistor generating a voltage that corresponds to the current being used to drive the three-phase motor.

2. The circuit of claim 1, the regulating circuit being configured to compare the voltage across the single current sense resistor at a first time with the voltage across the single current sense resistor at a second time to measure current through a motor lead being driven to a highest voltage.

3. The circuit of claim 2 further comprising:
an analog-to-digital converter for converting voltages across the single current sense resistor to digital values; and
the regulating circuit being configured to read the digital values generated by the analog-to-digital converter, the regulating circuit measuring current through the motor lead being driven to the highest voltage from a digital value read at the first time that is subtracted from the digital value read at the second time.

4. The circuit of claim 3 further comprising:
at least one switch in series with the current sense resistor; and
the regulating circuit being configured to open the at least one switch at a beginning of a chop cycle to enable magnetic flux in the current sense transformer to be reset and to close the at least one switch to enable the current sense resistor to receive a current from the secondary winding.

5. The circuit of claim 4, the at least one switch being a field effect transistor (FET), the FET having a source, a drain, and a gate with the gate of the FET being connected to the regulating circuit for receipt of a reset signal.

6. The circuit of claim 3, the current sense transformer being a gapped core transformer.

7. The circuit of claim 6, the regulating circuit being configured to turn on low side switches in the H-bridge driver at a beginning of a chop cycle to zero a voltage in each lead.

8. The circuit of claim 7, the regulating circuit reading a digital value from the A/D converter while the low side switches are turned on and identifying an offset voltage from the digital value.

9. The circuit of claim 4, the regulating circuit being a digital signal processor.

10. A method for sensing current in at least two leads of a three-phase motor comprising:
supplying DC power to a primary winding of a current sense transformer;
selectively coupling the primary winding of the current sense transformer to one or more leads in a three-phase motor;
measuring a voltage across a resistor connected to a secondary winding of the current sense transformer; and
comparing voltages measured across the resistor to identify currents in at least one lead of the three-phase motor.

11. The method of claim 10 further comprising:
measuring the voltage across the resistor at a first time;
measuring the voltage across the resistor at a second time; and
subtracting the voltage measured at the first time from the voltage measured at the second time to identify a current in the motor lead of the three-phase motor being driven to a highest voltage.

12. The method of claim 10 further comprising:
measuring a voltage across the resistor at a first time, the measured voltage identifying a current in the motor lead of the three-phase motor being driven to a highest voltage;
measuring a voltage across the resistor at a second time; and
subtracting the voltage measured at the second time from the voltage measured at the first time to identify a current in the motor lead of the three-phase motor being driven to an intermediate voltage.

13. The method of claim 10 further comprising:
converting the voltage across the resistor to a digital value to identify a current in a motor lead.

14. The method of claim 10 further comprising:
resetting magnetic flux in the current sense transformer to enable the voltage across the resistor to be proportional to a current through the primary winding of the current sense transformer.

15. The method of claim 14, the resetting of the magnetic flux in the current sense transformer includes asserting a signal on a gate of at least one FET connected to the secondary winding of the current sense transformer.

16. The method of claim 10 further comprising:
connecting the motor leads of the three-phase motor to a terminal of a DC power supply at a beginning of a chop cycle to zero a voltage in each motor lead.

17. The method of claim 16, the connection of the motor leads to the DC power supply terminal further comprising:
operating low side switches in a H-bridge, which is connected to the current sense transformer and the DC power supply, to zero the motor leads; and
measuring the voltage across the resistor to identify an offset voltage while the low side switches are being operated to zero the motor leads.

18. A circuit for sensing current in at least two leads of a three-phase motor comprising:
a DC power supply having a pair of output terminals;
an H-bridge driver connected to one terminal of the DC power supply and being connected to leads of a three-phase motor to drive each lead to a voltage obtained from the DC power supply;
a regulating circuit for identifying the voltage to which each lead is to be driven and for controlling switches within the H-bridge circuit to drive each lead to an identified voltage; and
a single current sense resistor connected to the other terminal of the DC power supply and to the H-bridge driver; and
the regulating circuit being configured to compare a voltage across the single current sense resistor at a first time with a voltage across the single current sense resistor at a second time to measure a current through a motor lead.

19. The circuit of claim 18, the current being measured corresponds to a current through the motor lead being driven to a highest voltage.

20. The circuit of claim 19 further comprising:
an analog-to-digital converter for converting the voltage across the single current sense resistor to a digital value; and
the regulating circuit being configured to read the digital values generated by the analog-to-digital converter, the regulating circuit measuring current through the motor lead being driven to the highest voltage from a digital value read at the first time that is subtracted from the digital value read at the second time.

* * * * *